(12) United States Patent
Kanschat et al.

(10) Patent No.: US 8,638,129 B2
(45) Date of Patent: Jan. 28, 2014

(54) POWER CIRCUIT

(75) Inventors: Peter Kanschat, Soest (DE); Uwe Jansen, Werl (DE); Gerald Deboy, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 1037 days.

(21) Appl. No.: 12/195,157

(22) Filed: Aug. 20, 2008

(65) Prior Publication Data

US 2010/0045361 A1    Feb. 25, 2010

(51) Int. Cl.
*H03B 1/00*    (2006.01)

(52) U.S. Cl.
USPC ............ 327/108; 327/374; 327/377; 327/434

(58) Field of Classification Search
USPC ......... 327/108, 109, 374, 376, 377, 427, 432, 327/434, 436
See application file for complete search history.

(56) References Cited

U.S. PATENT DOCUMENTS

| | | | | |
|---|---|---|---|---|
| 5,710,508 A * | 1/1998 | Watanabe | ..................... | 323/284 |
| 6,643,144 B2 * | 11/2003 | Feldtkeller | ..................... | 363/16 |
| 6,717,785 B2 * | 4/2004 | Fukuda et al. | ................ | 361/93.1 |
| 2003/0206039 A1 * | 11/2003 | Sakata et al. | .................. | 327/108 |
| 2008/0129219 A1 * | 6/2008 | Smith et al. | .................... | 315/291 |

OTHER PUBLICATIONS

S. Park, "A Self-Boost Charge Pump Topology for a Gate Drive High-Side Power Supply", IEEE Transactions on Power Electronics, vol. 20, No. 2, Mar. 2005 (pp. 300-307).
J. Crebier, "Integrated Driver Power Supply for Power Switch", ISBN: 90-75815-07-7, 2003 (pp. 1-9).
R. Mitova, "Integrated gate driver power supply for high-side power switches", Laboratoire d'electrotechnique et electronique industrielle, Toulouse, France.

* cited by examiner

*Primary Examiner* — Long Nguyen
(74) *Attorney, Agent, or Firm* — Dicke, Billig & Czaja, PLLC

(57) ABSTRACT

A power circuit. One embodiment provides a circuit for driving a power transistor having a control electrode and a load path. The circuit includes a driver circuit configured to change the power transistor to a completely on or off state with the aid of a control signal supplied to the control electrode. A series circuit includes a semiconductor switching element and a capacitor. The series circuit is connected in parallel with the load path and the capacitor provides a supply voltage for the driver circuit.

24 Claims, 3 Drawing Sheets

POWER CIRCUIT

BACKGROUND

The invention relates to a circuit for supplying a driver circuit for a controllable power-electronic semiconductor switch.

Electronic power switches have two electrodes—usually referred to as the "source" and "drain"—between which the load current to be controlled flows through the semiconductor switch, as well as a control electrode—usually referred to as the "gate"—whose potential difference with respect to that electrode which is usually referred to as the source is decisive for determining whether the electrical connection in the semiconductor switch is open or closed for the load current to be controlled or is in an intermediate state. The relevant reference-ground potential of the gate electrode is thus the potential of the source electrode. If the reference-ground potential of the gate electrode, and the potential of the source electrode, is floating, (i.e., can change with respect to ground depending on the operating state of the circuit) the driver circuit which drives the gate electrode must be accordingly supplied with a voltage related to this floating reference-ground potential.

One example is a transistor half-bridge including two n-channel MOSFETs or IGBTs, as are used, for example, in inverter bridge circuits for driving three-phase motors. A half-bridge is a series circuit including two power semiconductor switches. A "high-side" power switch is connected between a high supply potential and the bridge output node, and a "low-side" power switch is connected between the bridge output node and a low supply potential (e.g., ground). The potential of the bridge output node has a value which is dependent on the switching state of the bridge, (i.e., is floating). The control voltage for the high-side power switch is applied between the gate electrode and the source electrode of the high-side power switch, the source electrode being at the floating potential of the bridge output node. The entire driver circuit which provides the control signals for the high-side power switch must therefore be operated with a voltage supply whose reference-ground potential is the floating potential of the bridge output node.

The voltage supply for the driver circuit, used to drive the gate electrode of the high-side power switch, must therefore be floating with respect to ground. According to the prior art, this is effected either by using a transformer, which is relatively expensive on account of the required inductances, or by using a bootstrap circuit. In this case, a series circuit including a diode and a capacitor is arranged relative to the drain-source path (load path) of the power transistor, the capacitor being connected to the source electrode and the diode being oriented in such a manner that a current can flow through it parallel to the load current through the power transistor. For the driver circuit, the supply voltage is tapped off at the capacitor. If the power transistor is open, the bootstrap circuit is live and the capacitor is charged. If the power switch is closed, (i.e., is on) the capacitor cannot be recharged but forms the voltage supply for the driver circuit. One problem with this design is that the semiconductor switch cannot be kept in an open state for any desired amount of time since eventually the capacitor of the bootstrap circuit will be discharged to such an extent that it no longer suffices as the voltage supply for the driver circuit.

This problem can be circumvented with the aid of additional switches, which are arranged in parallel with the power switch and are operated in clocked fashion, and further bootstrap circuits. However, these circuits are expensive since they each require a plurality of discrete components, (i.e., electronic components) which cannot be accommodated together with other electronic components in an integrated circuit.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIGURE(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a circuit for applying a supply voltage to the driver circuit for a controllable power-electronic semiconductor switch, which circuit can be produced in a cost-effective manner and also functions when the controllable electronic semiconductor switch is in the on state for any desired amount of time.

Figure 1:
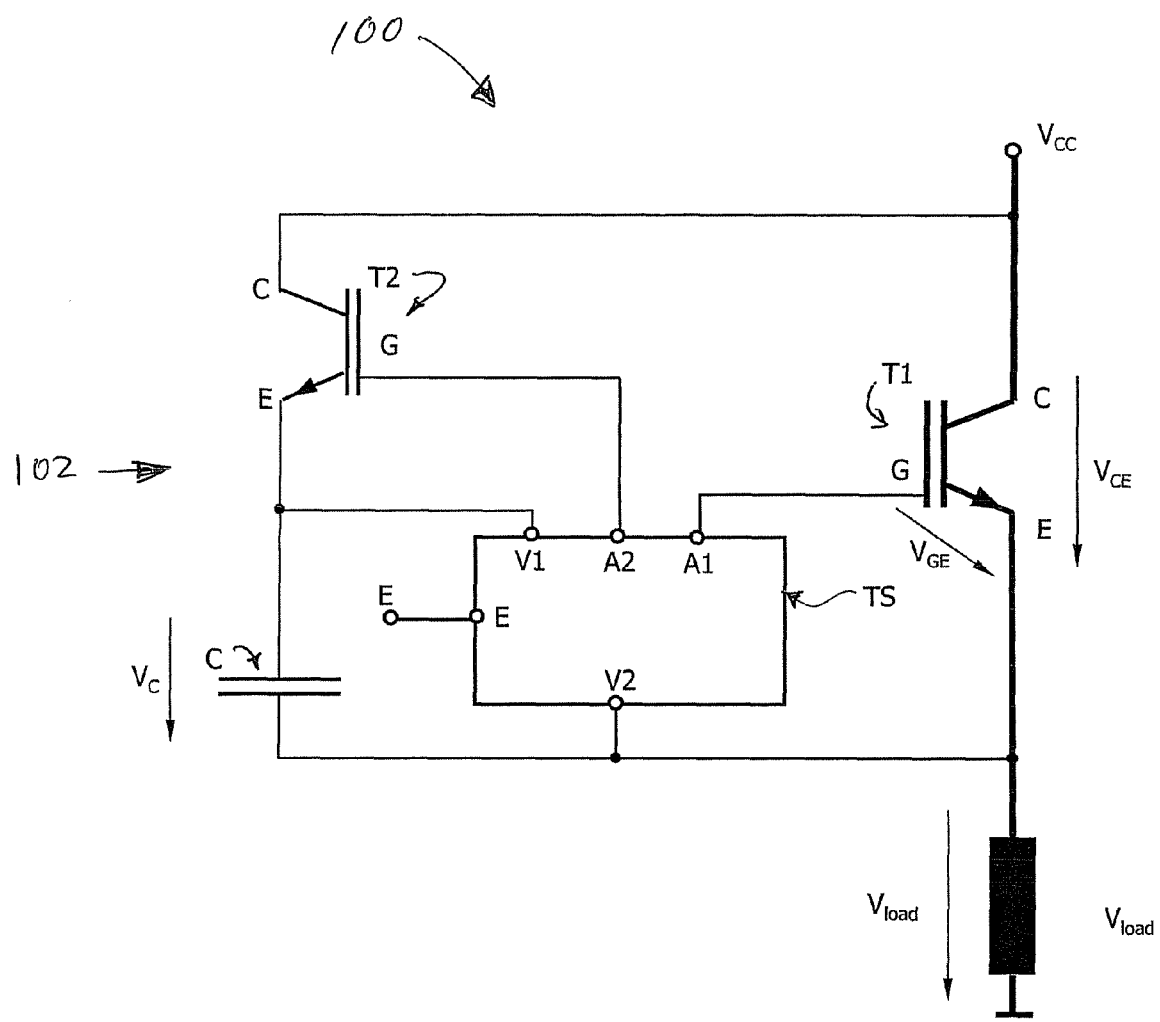
FIG. 1 illustrates a block diagram of one embodiment.

FIG. 1 illustrates one embodiment of a circuit 100 for driving a power transistor T1 having a control electrode and a load path. The circuit includes the following: a driver circuit T5 which is configured to change the power transistor T1 to a completely on or off state with the aid of a control signal which is supplied to the control electrode; a series circuit including a semiconductor switching element T2 and a capacitor C, the series circuit 102 being connected in parallel with the load path and the capacitor C providing a supply voltage for the driver circuit T5. The driver circuit T5 is also configured to drive the power transistor T1, in the event of the supply voltage falling below a first threshold value, with the aid of the control signal in such a manner that a voltage drop across the load path of the power transistor is higher than a threshold value.

Another embodiment relates to a method for driving a power transistor having a control electrode and a load path, a driver circuit for driving the power transistor being supplied by a capacitor which provides a supply voltage. The method includes the following: the control electrode is driven in accordance with an input signal with the aid of a control signal in such a manner that the power transistor is changed to an on state; the control electrode is driven with the aid of the control signal in such a manner that a voltage drop across the load path of the power transistor becomes higher than a threshold value in the event of the supply voltage falling below the first threshold value.

In one exemplary embodiment according to FIG. 1, an n-channel IGBT T1 is the power switch which is to be driven and controls the load current, (i.e., switches the load current on and off). Instead of an IGBT, it is readily possible to use a MOSFET. The power transistor T1 has a control connection G and load connections C and E, the gate, collector and emitter of the IGBT T1 in the present case. The collector-emitter current path is also referred to as the load path C-E. The power transistor T1 is connected, in the form of a high-side transistor, between a connection for an upper supply potential $V_{CC}$ and a load L. The load is connected between a connection for a low supply potential $V_{EE}$ and the load connection E (emitter) of the transistor T1.

The potential difference between the gate connection of the power switch T1 and the emitter connection of the power switch is decisive for the switching state of the power switch. The gate electrode of the power switch is driven using a driver circuit TS which may be in the form of an integrated circuit. The supply for the driver circuit TS is ensured by a capacitor C. A semiconductor switching element, for example a further transistor T2, is connected in series with the capacitor C, the series circuit including the capacitor C and the semiconductor switch T2 being connected in parallel with the load path of the power transistor T1. If the driver circuit is in the form of an integrated circuit, the semiconductor switching element T2 and possibly also the capacitor C may also be accommodated. The signal at an input IN is used to determine, from a super-ordinate control circuit—for example with the interposition of an optocoupler which is used as electrical isolation, whether the driver circuit TS has to switch the power transistor T1 to the on or off state.

A voltage $V_C$ is applied to the capacitor C. This voltage is also applied to the voltage supply connections V1 and V2 which are each connected to a capacitor electrode. The driver circuit TS is supplied with the voltage $V_C$ via connections V2 and V1, the capacitor C being used as a voltage source for the driver circuit. The potential of the connection V1 is above the potential of the connection V2 by the capacitor voltage $V_C$. The connection V2 is connected to the emitter electrode E of the power switch T1 to be controlled. The (floating) potential of the emitter electrode of the power transistor T1 is therefore the reference-ground potential for the driver circuit TS.

A series circuit which is formed from the additional transistor T2 and the capacitor C is connected in parallel with the load path C-E of the power transistor T1 (that is to say the current path between the collector and the emitter). This series circuit can be used, instead of a conventional bootstrap circuit, to supply the drive circuit of the high-side power transistor T1 in a floating manner. If the power transistor T1 is driven to the off state, its collector electrode C is consequently at the upper supply potential $V_{CC}$ and its emitter electrode E is virtually at the lower supply potential $V_{EE}$, and if the further transistor T2 is driven to the on state, the capacitor C is charged from the supply potential $V_{CC}$ until the transistor T2 is switched off. The point in time at which the transistor T2 is switched off may be selected in such a manner that the capacitor C is charged to a value below the maximum permissible driver supply voltage $(V_1-V_2)_{MAX}$. In order to prevent the capacitor from being charged to an excessively high voltage, a zener diode may be connected in parallel with the capacitor C. The capacitor voltage $V_C=(V_1-V_2)$ is then limited to the zener voltage of the zener diode. If the power transistor T1 is then activated, with the result that essentially the same potential is applied to its collector electrode C as to its emitter electrode, that is to say the voltage $V_{CE}$ across the load path of the power transistor T1 becomes very small, the capacitor C cannot be charged further. Since the further transistor T2 does not conduct in the reverse direction, the capacitor C can only be discharged via the voltage supply connections V1 and V2 of the driver circuit. The capacitor thus provides the supply voltage for the driver circuit TS, the voltage across the capacitor slowly decreasing during operation of the driver circuit TS in accordance with the power consumption of the driver circuit TS.

In the case of longer switch-on times of the power transistor T1 or in the case of capacitors C which are very small for reasons of space, it would only be a matter of time until the voltage in the capacitor C had fallen to such an extent that the driver circuit TS would no longer be supplied with sufficient voltage for proper operation and the function of the circuit would thus be disrupted.

In order to avoid this scenario, the supply voltage of the driver circuit TS, which is simultaneously the voltage $V_C$ across the capacitor C, may be monitored and, when this voltage $V_C$ falls below a first threshold value Umin, the power transistor T1 can be driven via its gate electrode G in such a manner that the voltage drop $V_{CE}$ across the load path of the power transistor is at least higher than the first threshold value and the capacitor can consequently be recharged again. In this case, the gate electrode G of the power transistor T1 is driven in such a manner that the conductivity of the load path current path is at least briefly reduced to such an extent that the voltage drop $V_{CE}$ between the collector and the emitter at least reaches a desired value which corresponds to a desired supply voltage for the driver circuit TS. At the same time, the semiconductor switching element, that is to say the transistor T2, is switched to the completely on state. The capacitor C is thus charged. As soon as its voltage has reached an upper switching threshold, the power transistor T1 is switched to the fully on state again. The further transistor T2 can then also be driven to the off state again. The flow of load current through the power transistor T1 is hardly affected by this only very brief "partial" disconnection of the power transistor T1, at least in the case of inductive loads which are important in practice.

In one embodiment illustrated in FIG. 1, the function described above is provided by the driver circuit TS. The driver circuit TS is thus configured to at least partially discharge the gate electrode G and consequently to reduce the conductivity of the power transistor T1 if the capacitor voltage $V_C$, that is to say the supply voltage of the driver circuit TS, falls below the first threshold value Umin. The driver circuit TS may also be configured to drive the gate electrode G to the completely off state if the capacitor voltage $V_C$ falls below a second threshold value which is lower than the first threshold value Umin in order to charge the capacitor in an even faster manner. The discharging of the gate electrode G may either be carried out for a predetermined amount of time or may be continued until a predetermined amount of charge has flowed away from the gate electrode. The driver circuit is also configured to drive the semiconductor switching element T2 to the on state if the capacitor voltage $V_C$ falls below the first threshold value Umin and to drive the switching element to the off state again if the supply voltage $V_C$ again exceeds the first threshold value Umin and/or reaches the desired value.

In the case of conventional applications of power-electronic components, for example for driving a three-phase motor using pulse width modulation for the purpose of controlling the speed, IGBTs, for example, are used as the electronic power switches T1, in the case of which the potential of the gate electrode must be 8 V to 20 V above the potential of the emitter electrode for the completely on state. The supply voltage of the main circuit, which is simultaneously the voltage which is applied to the load when the IGBT T1 is switched on, is typically several hundred volts. The voltage needed to supply the driver circuit TS is thus, at most, only a few percent of the maximum load voltage. The amount of power required by the driver circuit TS is extremely small in comparison with the load current. It is thus possible to keep the period in which the power switch T1 must have a state of reduced conductivity instead of the completely on state for the purpose of charging the capacitor C very much shorter than the switch-on times of the power switch T1. The losses caused by this operation on the load path of the power switch T1 are thus insignificant.

Figure 2:
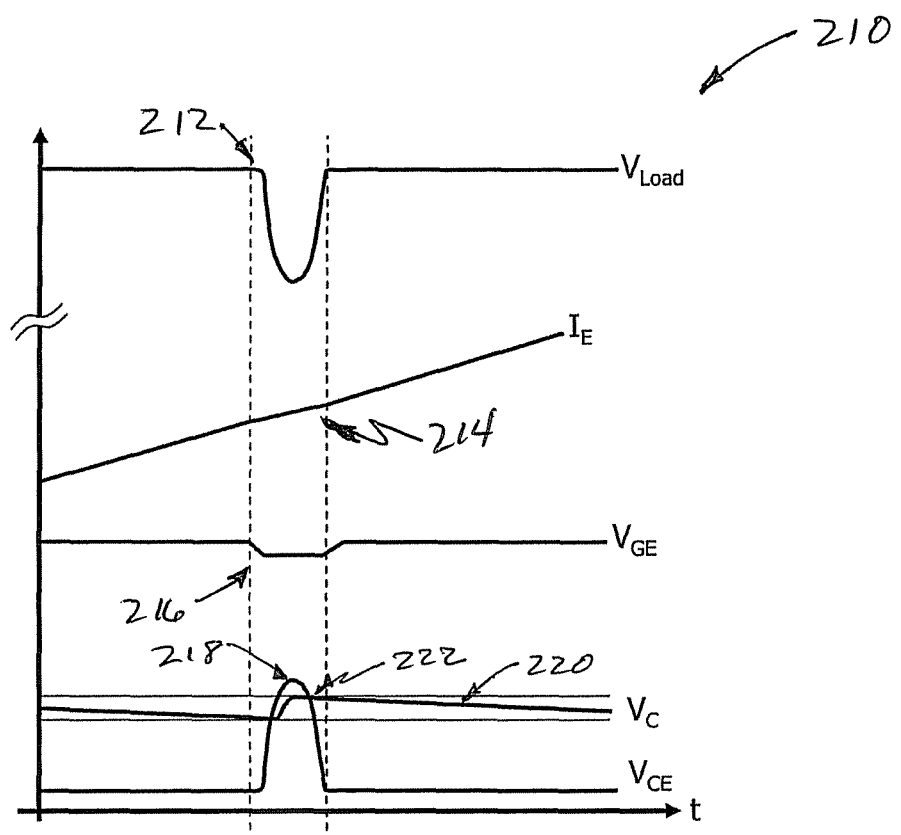
FIG. 2 illustrates a temporal profile of a plurality of electrical variables in one embodiment according to FIG. 1, assuming an inductive load.

Assuming an inductive load, FIG. 2 illustrates temporal profiles 210 of electrical variables in the circuit according to FIG. 1. The symbol $V_{load}$ denotes the load voltage across the inductive load L. As indicated at 212, the load voltage $V_{load}$ briefly falls slightly during the charging time for the capacitor C. Current $I_E$ represents the current through the emitter electrode of the power transistor T1, which is also led through an inductive load. The current $I_E$ rises to a slightly lesser extent than before during the charging time for the capacitor, indicated at 214. The control voltage $V_{GE}$ for the gate electrode G of the power transistor T1 is reduced somewhat during the operation of charging the capacitor C (indicated at 216) in order to at least partially discharge the gate electrode G and achieve the abovementioned reduction in the conductivity of the load path current path. So that the charging operation can take place, the collector-emitter voltage $V_{CE}$ across the power transistor T1 rises briefly above the value which is at approximately zero in the completely on state, indicated at 218. After the operation of recharging the capacitor C, the capacitor voltage slowly falls again in accordance with the power consumption of the driver circuit TS as a result of leakage currents and the driver circuit's own power requirement, indicated at 220. The capacitor voltage $V_C$ is quickly raised to the upper desired value during the charging operation, indicated at 222.

Figure 3:
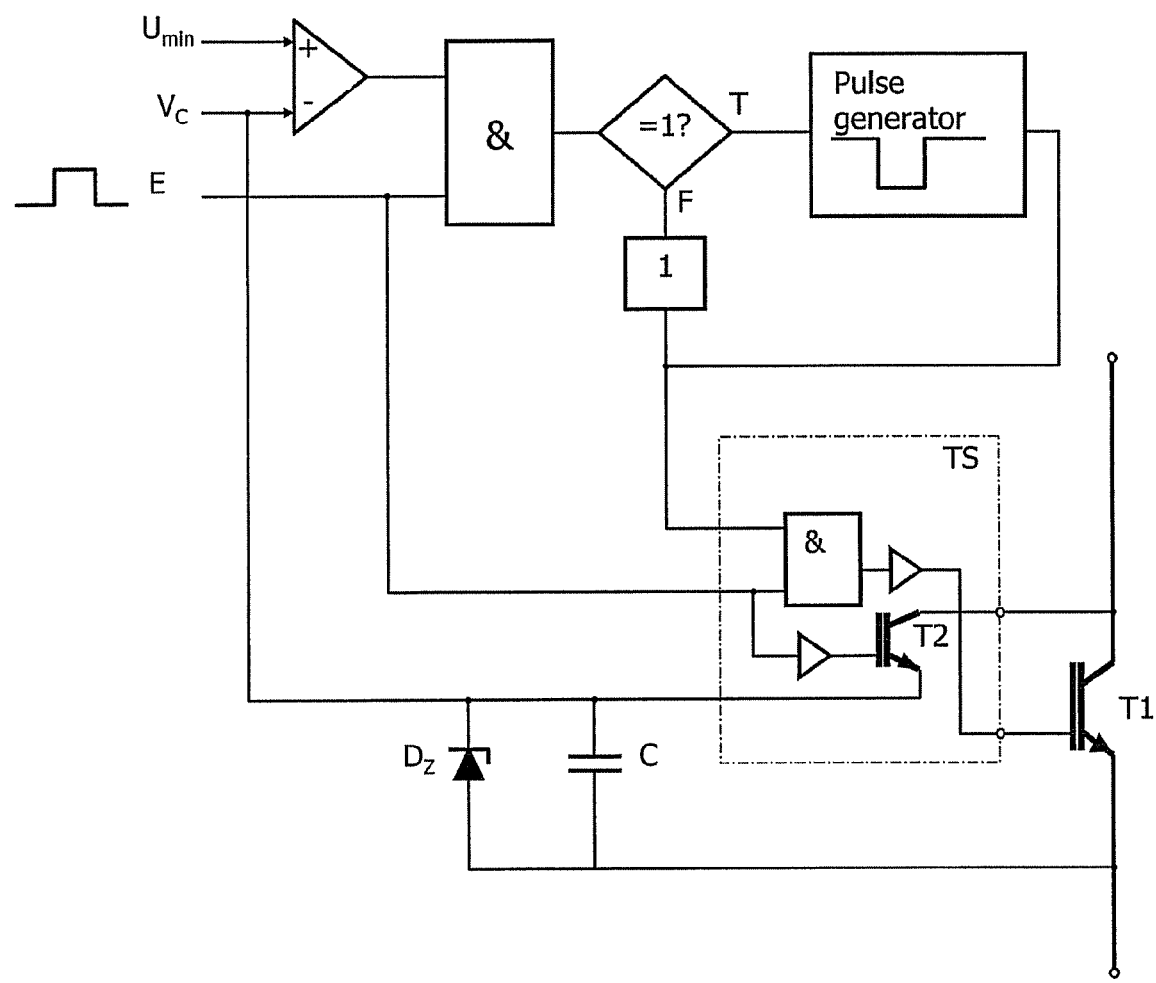
FIG. 3 illustrates a block diagram of one embodiment.

FIG. 3 illustrates one embodiment of how the controller can be configured in a somewhat more detailed manner. As soon as the voltage $V_C$ across the capacitor C falls below the lower limit value Umin and the superordinate controller transmits a signal IN which is intended to switch on the power transistor T1, a pulse generator superimposes a control pulse or a series of short control pulses on the control signal IN, which control pulses are used to reduce the gate voltage $V_{GE}$ across the power transistor T1. The additional transistor T2 contained in the driver circuit TS must be switched on in this case in order to enable a charging operation. A zener diode $D_Z$ connected in parallel with the capacitor C may be provided in order to limit the maximum voltage across the capacitor to the zener voltage of the zener diode.

So that the capacitor is charged even at the beginning, the transistor T2 may also be switched on when the power transistor T1 has been switched off. Since, however, the high supply voltage of the main circuit is then applied to the supply terminals of the driver circuit, this state should be maintained only briefly in order to avoid dangerously high losses in the zener diode $D_Z$. The power loss of the zener diode should be dimensioned in accordance with the reaction time of the driver circuit which also drives the transistor T2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit for driving a power transistor having a control electrode and a load path, the circuit comprising:
    a driver circuit configured to drive the power transistor via a control signal supplied to the control electrode so as to control the on and off state of the power transistor; and
    a series circuit comprising a semiconductor switching element and a capacitor, the series circuit being coupled in parallel with the load path and the capacitor providing a supply voltage to the driver circuit,
    wherein the driver circuit, when the supply voltage falls below a first threshold value, is configured to drive the power transistor via the control signal to create a voltage drop across the load path of the power transistor which is higher than the first threshold value, wherein the first threshold value is greater than a minimum value of the supply voltage required for proper operation of the driver circuit.

2. The circuit of claim 1, wherein the driver circuit is configured to drive the power transistor via the control signal to the control electrode so as to turn the power transistor from a completely on state to a partially on state to reduce a conductivity of the power transistor when the supply voltage falls below the first threshold value.

3. The circuit of claim 1, wherein the driver circuit is configured to drive the control electrode to the off state with the aid of the control signal when the supply voltage falls below a second threshold value.

4. The circuit of claim 1, wherein the driver circuit is configured to drive the control electrode to increase the voltage drop across the load path for a predefined amount of time.

5. The circuit of claim 1, comprising wherein the driver circuit is configured to reduce a voltage level of the control signal applied to the control electrode by a predefined amount.

6. The circuit of claim 1, wherein the driver circuit is configured to drive the semiconductor switching element to the on state when the supply voltage falls below the first threshold value and to drive the semiconductor switching element to the off state again when the supply voltage exceeds the first threshold value.

7. A circuit for driving a power transistor having a control electrode and a load path, the circuit comprising:
    a driver circuit configured to control the on and off state of the power transistor via a control signal supplied by the driver circuit to the control electrode;
    a series circuit comprising a semiconductor switching element and a capacitor, the series circuit being coupled in parallel with the load path and the capacitor providing a supply voltage to power the driver circuit,
    the driver circuit being configured to drive the power transistor from a completely on state to a partially on state, in the event of the supply voltage falling below a first threshold value, via the control signal such that a voltage drop across the load path of the power transistor is higher than the first threshold value; and
    a pulse generator configured to impose one or more control pulse onto the control signal when the supply voltage falls below the first threshold value.

8. A method for driving a power transistor having a control electrode and a load path, a driver circuit for driving the power transistor being supplied by a capacitor which provides a supply voltage to the drive circuit, the method comprising:
    driving the control electrode with the driver circuit in accordance in response an input signal received by the driver circuit via a control signal provided by the driver circuit to the control electrode in such a manner that the power transistor is changed to an on state;
    driving the control electrode with the drive circuit via the control signal in such a manner to turn the power transistor to only a partially on state so that a voltage drop across the load path of the power transistor is driven higher than a first threshold value when the supply voltage to the driver circuit falls below the first threshold value, wherein the first threshold value is greater than a minimum value of the supply voltage required for proper operation of the driver circuit.

9. The method of claim 8, comprising the driver circuit driving the power transistor via the control signal to the control electrode to turn the power transistor from the completely on state to a partially to reduce a conductivity of the power transistor when the supply voltage falls below the first threshold value.

10. The method of claim 8, comprising driving the control electrode to an off state with the aid of the control signal when the supply voltage falls below a second threshold value, the second threshold value being less than the first threshold value.

11. The method of claim 8, comprising driving the control electrode to increase the voltage drop across the load path for a predefined amount of time.

12. The method of claim 8, comprising reducing a voltage level of the control signal applied to the control electrode by a predetermined amount.

13. A power circuit comprising:
a power transistor having a control electrode and a load path;
a supply circuit comprising:
a driver circuit configured to control the on and off state of a power transistor via a control signal supplied to the control electrode by the driver circuit; and
a series circuit comprising a semiconductor switching element and a capacitor, the series circuit being connected in parallel with the load path and the capacitor providing a supply voltage for the driver circuit,
the driver circuit, in the event of the supply voltage falling below a first threshold value, configured to drive the power transistor via the control signal in such a manner that a voltage drop across the load path of the power transistor is driven higher than the first threshold value, wherein the first threshold value is greater than a minimum value of the supply voltage required for proper operation of the driver circuit.

14. The circuit of claim 13, wherein the driver circuit is configured to drive the power transistor to a partially on state via the control signal to the control electrode so as to reduce a conductivity of the load path when the supply voltage falls below the first threshold value and thereby drive the voltage drop across the load path higher.

15. The circuit of claim 13, wherein the driver circuit is configured to drive the control electrode to turn the power transistor to the off state via the control signal when the supply voltage falls below a second threshold value.

16. The circuit of claim 13, wherein the driver circuit is configured to drive the electrode to increase the voltage drop across the load path for a predefined amount of time.

17. The circuit of claim 13, comprising wherein the driver circuit is configured to reduce a voltage level of the control signal applied to the control electrode by a predefined amount.

18. The circuit of claim 15, comprising wherein the driver circuit is configured to drive the semiconductor switching element to the on state when the supply voltage falls below the first threshold value and to drive the switching element to the off state again when the supply voltage exceeds a third threshold value.

19. A power circuit comprising:
a power transistor having a control electrode and a load path;
a supply circuit comprising:
a driver circuit configured to control the on and off state of the power transistor via a control signal supplied to the control electrode by the driver circuit;
a series circuit comprising a semiconductor switching element and a capacitor, the series circuit being connected in parallel with the load path and the capacitor providing a supply voltage to power the driver circuit,
the driver circuit, if the supply voltage falls below a first threshold value, being configured to drive the power transistor via the control signal so as to turn the power transistor from a completely on state to a partially on state so that a voltage drop across the load path of the power transistor becomes greater than the threshold value; and
a pulse generator which is configured to impose one or more control pulses onto the control signal to the control electrode when the supply voltage falls below the first threshold value.

20. A method comprising:
providing a power transistor having a control electrode and a load path, a driver circuit for driving the power transistor, and a capacitor to provide a supply voltage to the driver circuit;
driving the control electrode via a control signal provided by the driver circuit in response to an input signal received by the driver circuit to drive the power transistor to an on state; and
driving the control electrode via the control signal to drive the power transistor in such a manner that a voltage drop across the load path of the power transistor is driven higher than a first threshold value in response to the supply voltage falling below the first threshold value, wherein the first threshold value is greater than a minimum value of the supply voltage required for proper operation of the driver circuit.

21. The method of claim 20, comprising driving the control electrode via the control signal to drive the power transistor from the on state to a partially on state so as to reduce a conductivity of the load path and drive the voltage drop across the load path higher when the supply voltage falls below the first threshold value.

22. The method of claim 21, comprising driving the control electrode via the control signal to drive the power transistor the an off state when the supply voltage falls below a second threshold value.

23. The method of claim 22, comprising driving the control electrode via the control signal to increase the voltage drop across the load path for a predefined amount of time.

24. The method of claim 23, comprising reducing a voltage level of the control signal applied to the control electrode by a predefined amount.

* * * * *